United States Patent [19]

Sakura

[11] Patent Number: 5,247,211
[45] Date of Patent: Sep. 21, 1993

[54] LIGHT-RECEIVING CIRCUIT

[75] Inventor: Shigeyuki Sakura, Kawasaki, Japan

[73] Assignee: Kabushiki Kaisha Toshiba, Kanagawa, Japan

[21] Appl. No.: 835,928

[22] PCT Filed: Jul. 1, 1991

[86] PCT No.: PCT/JP91/00883

§ 371 Date: Mar. 2, 1992

§ 102(e) Date: Mar. 2, 1992

[87] PCT Pub. No.: WO92/01348

PCT Pub. Date: Jan. 23, 1992

[30] Foreign Application Priority Data

Jul. 3, 1990 [JP] Japan .................. 2-174510

[51] Int. Cl.$^5$ .................................. H03K 5/153
[52] U.S. Cl. .................. 307/358; 307/311; 307/351; 250/214 A
[58] Field of Search .............. 250/214 A; 307/268, 307/311, 351, 358; 328/164

[56] References Cited

U.S. PATENT DOCUMENTS 4,000,397  12/1976  Herbert et al. .............. 235/462
4,241,455  12/1980  Eibner ........................ 455/600
5,030,925   6/1991  Taylor ........................ 330/308

FOREIGN PATENT DOCUMENTS 0192410   8/1986  European Pat. Off. .
63-25738  11/1982  Japan .
3-45032    2/1991  Japan .
3-171908   7/1991  Japan .

OTHER PUBLICATIONS

Sakura, et al., Fiber Optic Link For Digital Audio Interface, IEEE Transactions on Consumer Electronics, vol. 34, No. 3, Aug. 1988, pp. 667-669.

Primary Examiner—John S. Heyman
Assistant Examiner—Shawn Riley
Attorney, Agent, or Firm—Finnegan, Henderson, Farabow, Garrett & Dunner

[57] ABSTRACT

A light-receiving circuit according to the present invention incorporates an amplifier 12 having differential output terminals, and it is intended that normal-phase and inverted-phase outputs (Vp, −Vp) of the amplifier 12 be supplied to a comparator 34 at an appropriate threshold level at all times. To achieve this intention, a peak-value voltage (Vi) of the normal-phase and inverted-phase outputs of the amplifier 12 is detected by a peak value detector 26, and is converted into a current by means of a voltage-current converter 28 having a mutual conductance of gm. The voltage-current converter 28 has differential output terminals, from which a normal-phase output ($I_+ = gm \cdot Vi$) and an inverted-phase output ($I_- = gm \cdot Vi$) are produced, respectively. The currents ($I_+$, $I_-$) are converted into voltages by means of resistors R10 and R12. The resultant currents are subtracted from the normal-phase and inverted-phase outputs (Vp, −Vp) of the amplifier 12, respectively, so that the normal-phase and inverted-phase outputs (Vp, −Vp) are shifted in level to the degree corresponding to the same voltage. The signals, thus shifted in level, are supplied to the normal-phase and inverted-phase input terminals of the comparator 34.

13 Claims, 4 Drawing Sheets

LIGHT-RECEIVING CIRCUIT

TECHNICAL FIELD

The present invention relates to a light-receiving circuit, and more particularly to a light-receiving circuit which converts a photo signal into an electric signal and outputs the electric signal.

BACKGROUND ART

A conventional light-receiving circuit, which converts a photo signal into an electric signal and outputs the electric signal, has such a circuit configuration as is shown in the "Light Receiver" disclosed in Published Examined Japanese Patent Application (PEJPA) No. 63-25738.

More specifically, as is shown in FIG. 1, an amplifier 102 has its input terminal 104 connected to a photodiode 100, and has its output terminal 106 connected to the positive input terminal 110 of a comparator 108. A reference potential-generating circuit 112 is provided. The output terminal 114 of this reference potential-generating circuit 112 is connected to the negative input terminal 118 of a peak value-detecting circuit 116 by way of resistor R100, and is further connected to the output terminal 106 of the amplifier 102 by way of resistors R102 and R104. The positive input terminal 120 of the peak value-detecting circuit 116 is connected to node W, which is between resistors R102 and R104. The output terminal 122 of the peak value-detecting circuit 116 is connected to node X by way of diode D100. Node X is connected to a constant current source I100. Node X is further connected to the negative input terminal 124 of the comparator 108 by way of node Y, to which a capacitor C100 is connected. The output terminal 126 of the comparator 108 is connected to the output terminal 128 of the receiver.

In the light-receiving circuit of the above circuit configuration, the threshold value is automatically set to have an optimal level, without reference to a change in photo signal E supplied to the photodiode 100.

It is proposed that the amplifier 102 to which the photodiode 100 is connected be replaced with an amplifier having differential output terminals of normal and inverted phases. Such a proposal is made, for example, in Japanese Patent Application No. 1-180717 entitled "Widely-Dynamic Light-Receiving Circuit" and Japanese Patent Application 1-311334 entitled "Light-Receiving Circuit". When the amplifier having differential output terminals is employed, it is possible to make the best use of the amplitude of photo signal E, and the amplifier can have a wide band and be widely-dynamic.

The amplifier mentioned above has differential output terminals. Thus, even if the amplifier is incorporated in a circuit wherein the threshold value is automatically set to have an optimal level, such as the circuit shown in FIG. 1, only one of its output terminals, a normal-phase one or an inverted-phase one, can be connected to a given circuit. Accordingly, the gain to be obtained is substantially ½ of the gain obtained in the case where both output terminals are connected to that given circuit, and the amplifier fails to sufficiently achieve its advantages.

As may be understood from the above, the circuit mentioned above is designed on condition that the amplifier 102 to be incorporated has a single-phase output terminal. The circuit is not designed for use with an amplifier having differential output terminals As mentioned above, an amplifier having differential output terminals is not suitable for incorporation into such a circuit configuration as is disclosed in Published Examined Japanese Patent Application (PEJPA) No. 63-25738 entitled "Light Receiver".

Accordingly, an object of the present invention is to provide a light-receiving circuit which has a circuit configuration permitting an amplifier with differential output terminals to be suitably incorporated therein, which employs a wide-band, widely-dynamic amplifier, and which constantly maintains the threshold value at an optimal level without reference to a change in the photo signal.

DISCLOSURE OF INVENTION

To achieve the above object, the light-receiving circuit of the present invention comprises:

an amplifier for amplifying a signal supplied from a light-receiving element, the amplifier having normal-phase and inverted-phase output terminals;

a peak value detector for detecting a peak value of an output of the amplifier, the peak value detector having normal-phase and inverted-phase input terminals which are connected to the normal-phase output terminal of the amplifier, respectively;

a voltage-current converter having a normal-phase output terminal, an inverted-phase output terminal, and an input terminal which is connected to an output terminal of the peak value detector;

a first resistor inserted between the normal-phase output terminal of the voltage-current converter and the normal-phase output terminal of the peak value detector;

a second resistor inserted between the inverted-phase output terminal of the voltage-current converter and the inverted-phase output terminal of the peak value detector; and a comparator for comparing outputs of the amplifier with each other, the comparator having normal-phase and inverted-phase input terminals which are connected to the normal-phase and inverted-phase output terminals of the voltage-current converter, respectively.

In the light-receiving circuit having the above circuit configuration, a peak-value voltage of a normal-phase output of the amplifier and a peak-value voltage of an inverted-phase output of the amplifier are detected by the peak-value detector. The peak-value voltages are converted into currents by the voltage-current converter. By this voltage-current converter, a current corresponding to the normal-phase output and a current corresponding to the inverted-phase are output. The current corresponding to the normal-phase output is converted into a first voltage by the first resistor, while the current corresponding to the inverted-phase output is converted into a second voltage by the second resistor. The first and second voltages are subtracted from the normal-phase and inverted-phase outputs of the amplifier, respectively. By this subtraction, the normal-phase and inverted-phase outputs of the amplifier are shifted in level to the degree corresponding to the same voltage. The two level-shifted signals are supplied to the normal-phase and inverted-phase input terminals of the comparator, so that the signals can be compared with each other with an optimal threshold level at all times.

BEST MODE OF CARRYING OUT THE INVENTION

Embodiments of the present invention will be described below, with reference to the accompanying drawings.

Figure 2:
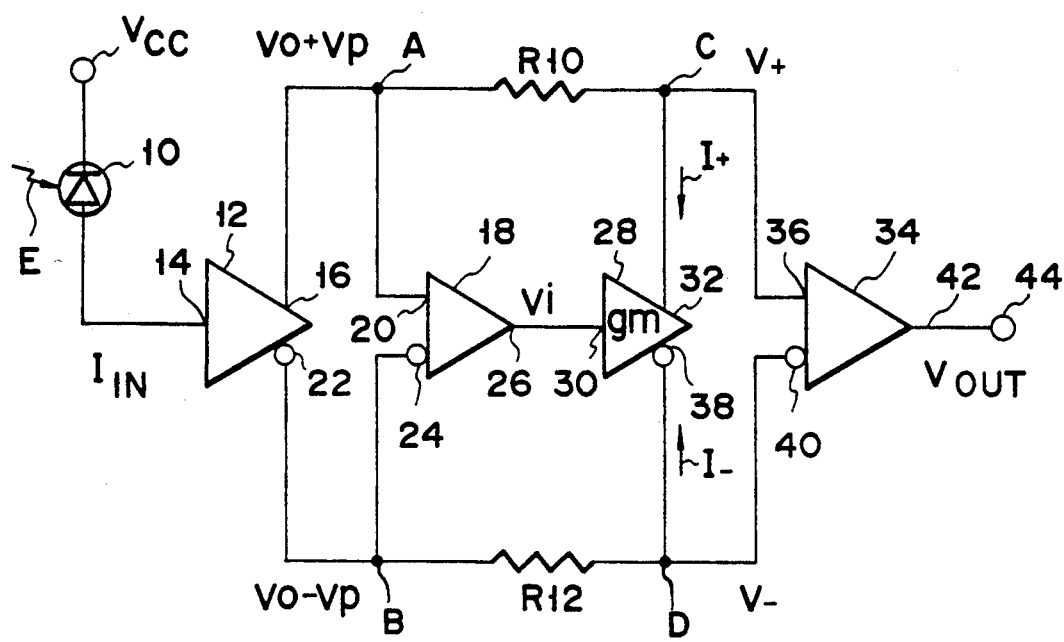
FIG. 2 is a circuit diagram showing a light-receiving circuit according to the first embodiment of the present invention.
Figure 3:
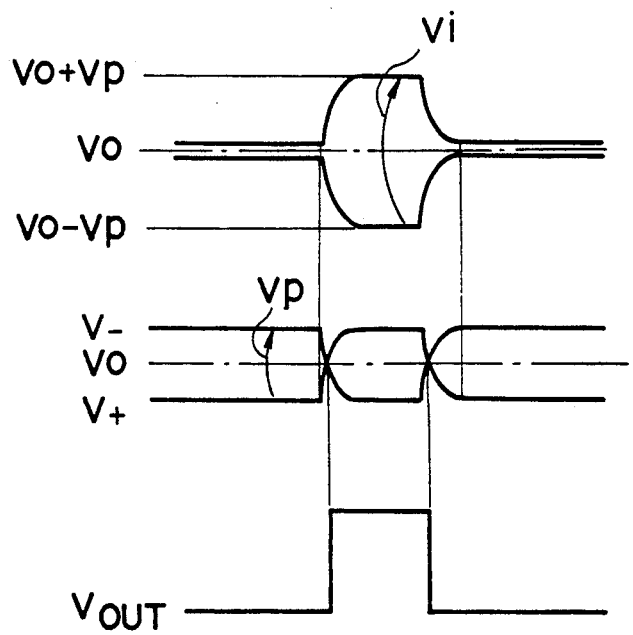
FIG. 3 is a waveform chart showing the operation of the light-receiving circuit of the first embodiment of the present invention.

FIG. 2 is a circuit diagram showing a light-receiving circuit according to the first embodiment of the present invention, and FIG. 3 is a waveform chart showing the operation of the light-receiving circuit of the first embodiment.

As is shown in the Figures, the anode of a photodiode 10 is connected to a power supply Vcc, while the cathode thereof is connected to the input terminal 14 of an amplifier 12. The normal-phase output terminal 16 of the amplifier 12 is connected to the normal-phase input terminal 20 of a peak value-detecting circuit 18 by way of node A, and the inverted-phase output terminal 22 of the amplifier 12 is connected to the inverted-phase input terminal 24 of the peak value-detecting circuit 18 by way of node B. The output terminal 26 of the peak value-detecting circuit 18 is connected to the input terminal 30 of a voltage-current converter circuit 28. The normal-phase output terminal 32 of the voltage-current converter circuit 28 is connected to the normal-phase input terminal 36 of a comparator 34 by way of node C. The inverted-phase output terminal 38 of the voltage-current converter circuit 28 is connected to the inverted-phase input terminal 40 of the comparator 34 by way of node D. Nodes A and C are connected to each other by means of resistor R10. Similarly, nodes B and D are connected to each other by means of resistor R12. The output terminal 42 of the comparator 34 is connected to the output terminal 44 of the light-receiving circuit.

The operation of the light-receiving circuit having the above circuit configuration will be described, referring to calculation formulas.

Upon supply of a light signal E, the photodiode 10 outputs a reception signal $I_{IN}$. In response to the supply of this reception signal $I_{IN}$, the amplifier 12 outputs a normal-phase reception signal Vo+Vp and an inverted-phase reception signal Vo−Vp, both determined in accordance with the reception signal $I_{IN}$.

In the present specification, the reference symbol denoting each signal is associated with the voltage or current value of the signal. To be more specific, in the reference symbols "Vo+Vp" and "Vo−Vp" respectively denoting the normal-phase and inverted-phase reception signals, "Vo" indicates a DC voltage component, and "Vp" indicates a signal voltage component (signal amplitude).

Upon supply of the normal-phase reception signal Vo+Vp and inverted-phase reception signal Vo−Vp, the peak value-detecting circuit 18 detects peak values of the voltages of the signals and outputs peak value signals Vi. The peaks of the voltages are, for example, twice as high as a signal amplitude voltage |Vp| (absolute value). Thus, the voltage Vi of the peak value signals produced from the output terminal 26 of the peak value-detecting circuit 18 is expressed as follows:

$$Vi = 2|Vp| \quad (1)$$

Upon supply of the peak value signals Vi, the voltage-current converter circuit 28 outputs a normal-phase peak value signal $I_+$ and an inverted-phase peak value signal $I_-$, both determined in accordance with the voltage Vi of the peak value signals.

Let it be assumed that the mutual conductance of the voltage-current converter circuit 28 is denoted by gm.

In this case, the normal-phase peak value signal current $I_+$ produced from the normal-phase output terminal 32 of the voltage-current converter circuit 28 is expressed as follows:

$$\begin{aligned} I_+ &= Io + gm \cdot Vi \\ &= Io + 2 \cdot gm \cdot |Vp| \end{aligned} \quad (2)$$

On the other hand, the inverted-phase peak value signal current $I_-$ produced from the inverted-phase output terminal 38 is expressed as follows:

$$\begin{aligned} I_- &= Io - gm \cdot Vi \\ &= Io - 2 \cdot gm \cdot |Vp| \end{aligned} \quad (3)$$

The "Io" represents an initial current component which may flow through the current-voltage converter circuit 28 before the supply of the peak value signal Vi.

Assuming that each of resistors R10 and R12 has resistance R, the normal-phase signal voltage $V_+$ supplied to the normal-phase input terminal 36 of the comparator 34 is given by the following:

$$\begin{aligned} V_+ &= Vo + Vp - R \cdot I_+ \\ &= Vo - R \cdot Io - 2 \cdot gm \cdot R|Vp| + Vp \end{aligned} \quad (4)$$

Similarly, the inverted-phase signal voltage $V_-$ supplied to the inverted-phase input terminal 40 is given by the following:

$$\begin{aligned} V_- &= Vo - Vp - RD \cdot I_- \\ &= Vo - R \cdot Io + 2 \cdot gm \cdot R|Vp| - Vp \end{aligned} \quad (5)$$

In the case where the relationship between the mutual conductance gm and the resistance R is represented by:

$$R \cdot gm = \tfrac{1}{4},$$

formulas (4) and (5) can be respectively transformed as follows:

$$V_+ = Vo - R \cdot Io - (\tfrac{1}{2})|Vp| + Vp \quad (6)$$

$$V_- = Vo - R \cdot Io + (\tfrac{1}{2})|Vp| - Vp \quad (7)$$

In the right side of each of formulas (6) and (7), the first and second terms represent a DC voltage component, and the first and second terms of the right side of formula (6) are equal to those of the right side of formula (7). The third term represents a DC voltage component which varies in accordance with the voltage Vp of the signal amplitude. The fourth term represents the voltage of the signal amplitude itself.

As is shown in the waveform chart in FIG. 3, therefore, the voltage $V_o + V_p$ of the normal-phase reception signal output from the amplifier 12 and the voltage $V_o V_p$ of the inverted-phase reception signal also output from the amplifier 12 are shifted in level by the voltage which is half of that of the signal amplitude $|V_p|$, and are thus converted into a normal-phase signal of voltage $V_+$ and an inverted-phase signal of voltage $V_-$, respectively.

Due to the processing mentioned above, in the circuit of the first embodiment, the comparator 34 can constantly compare the normal-phase signal $V_+$ and the inverted-phase signal $V_-$ with each other at the level corresponding to the potential half that of the signal amplitude $|V_p|$, without reference to the value of the signal amplitude $|V_p|$. Accordingly, the comparator can compare the two signals with each other with an optimal threshold level at all times and produce an output signal $V_{out}$.

The light-receiving circuit of the second embodiment will now be described.

Figure 1:
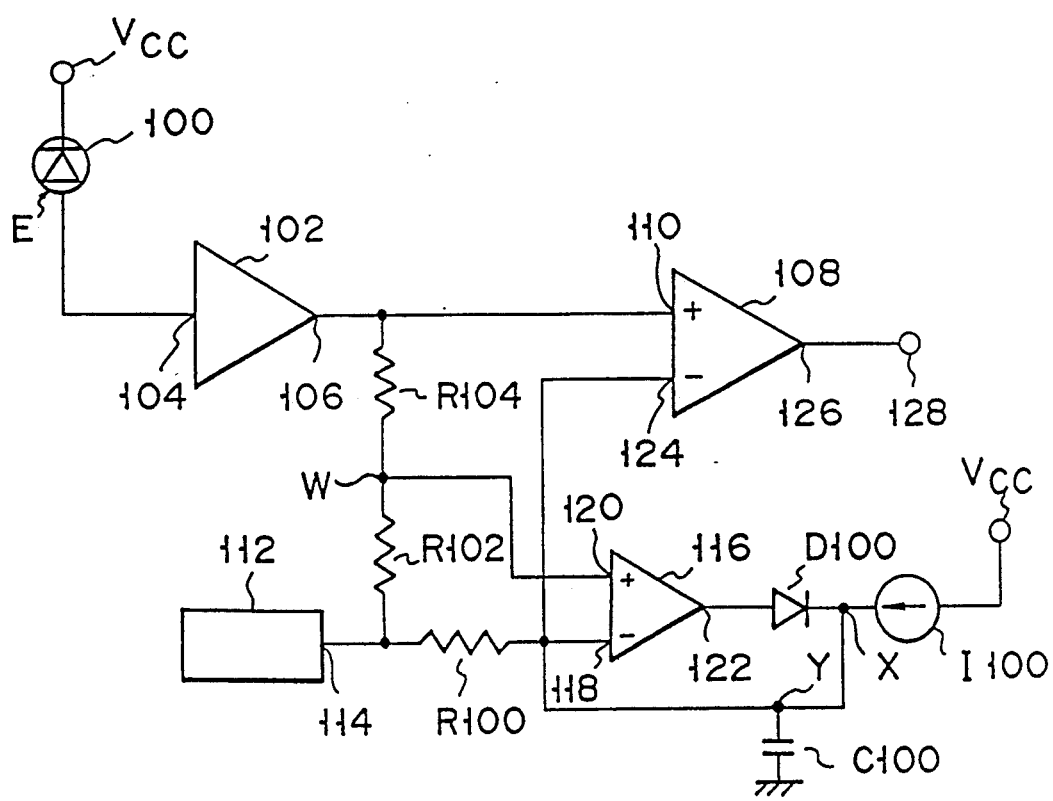
FIG. 1 is a circuit diagram showing a conventional light-receiving circuit.
Figure 4:
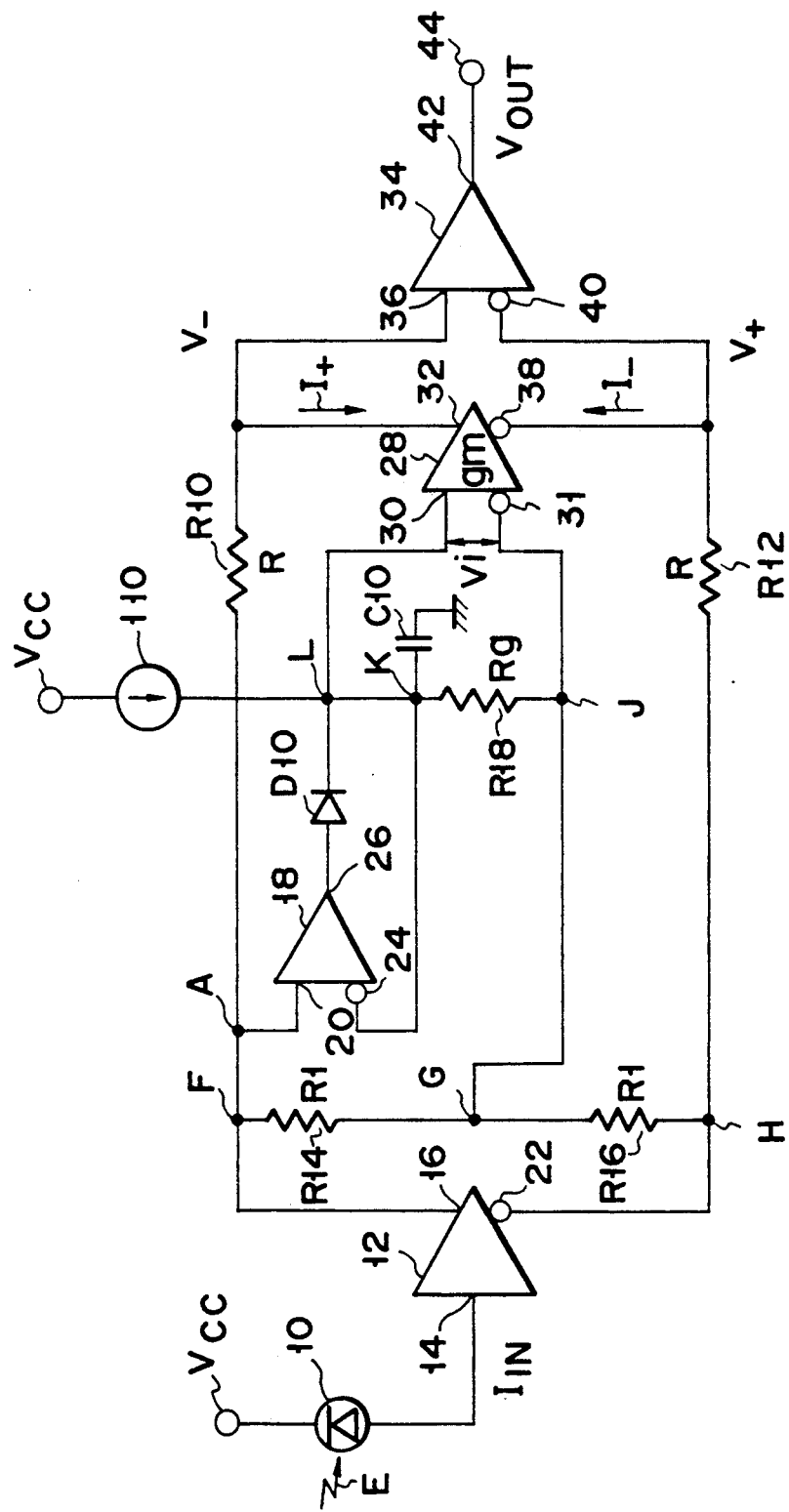
FIG. 4 is a circuit diagram showing a light-receiving circuit according to the second embodiment of the present invention.

FIG. 4 is a circuit diagram showing the light-receiving circuit of the second embodiment of the present invention, and FIGS. 5A through 5D are waveform charts each showing the operation of the light-receiving circuit of the second embodiment. In these Figures, the same reference symbols as those in FIGS. 2 and 3 are used to indicate the similar or corresponding structural components, and a description will be given only of the different circuit configurations from those shown in FIGS. 1 and 2.

As is shown in FIG. 4, in the circuit of the second embodiment, the normal-phase output terminal 16 of an amplifier 12 is connected to node F, where the line branches out. Node F is connected to node G by way of resistor R14. Similarly, the inverted-phase output terminal 22 of the amplifier 12 is connected to node H, where the line branches out. Node H is connected to node G by way of resistor R16. The potential at node G is set to be substantially ½ of the voltage applied between the normal-phase and inverted-phase output terminals 16 and 22, for example, by providing resistors R14 and R16 with the same resistance. The inverted-phase input terminal 31 of a voltage-current converter circuit 28 is connected to node G by way of node J. The inverted-phase input terminal 24 of a peak value-detecting circuit 18 is connected to node K. Nodes J and K are connected to each other by means of resistor R18. A capacitor C10 is connected to node K.

The normal-phase input terminal 20 of the peak value-detecting circuit 18 is connected to node A, which is connected to node F. The output terminal 26 of the peak value-detecting circuit 18 is connected to the anode of a diode D10. The cathode of this diode D10 is connected to node L. The normal-phase input terminal 30 of the voltage-current converter circuit 28 is connected to node L. Nodes L and K are connected to each other. A constant current source I10 is connected to node L.

The operation of the light-receiving circuit having the above circuit configuration will be described, referring to calculation formulas.

Let it be assumed that the current value of the constant current source I10 is denoted by Ig.

Also, let it be assumed that the resistance of each of resistors R14 and R16 is denoted by R1, that the resistance of resistor R18 is denoted by Rg, and that the relationship between resistance R1 and resistance Rg is given by the following:

$$\tfrac{1}{2}(R1) >> Rg$$

Further, let it be assumed that the resistance of each of resistors R10 and R12 is denoted by R, that the mutual conductance of the voltage-current converter circuit 28 is denoted by gm, and that the relationship between resistance R and mutual conductance gm is given by the following:

$$R \cdot gm = \tfrac{1}{2}$$

1. When light signal E is of a small value, i.e., when $|V_p| \leq Ig\,Rg$, the peak value-detecting circuit 18 does not operate. Thus, the input voltage Vi of the voltage-current converter circuit 28 satisfies the following formula:

$$Vi = Ig\,Rg \text{ (constant)} \quad (8)$$

Output currents $I_+$ and $I_-$ of the voltage-current converter circuit 28 are given by the following:

$$\begin{aligned} I_+ &= Io + gm \cdot Vi \\ &= Io + gm \cdot Rg \cdot Ig \text{ (constant)} \end{aligned} \quad (9)$$

$$\begin{aligned} I_- &= Io - gm \cdot Vi \\ &= Io - gm \cdot Rg \cdot Ig \text{ (constant)} \end{aligned} \quad (10)$$

Hence, input voltages $V_+$ and $V_-$ of the comparator 34 are given by the following:

$$\begin{aligned} V_+ &= Vo + Vp - I_+ \cdot R \\ &= Vo - Io \cdot R - (1/2)Ig \cdot Rg + Vp \end{aligned} \quad (11)$$

$$\begin{aligned} V_- &= Vo - Vp - I_- \cdot R \\ &= Vo - Io \cdot R + (1/2)Ig \cdot Rg - Vp \end{aligned} \quad (12)$$

In the right side of each of formulas (11) and (12), the first and second terms represent a DC voltage component. The third term also represents a DC voltage component, but the DC voltage component of input voltage $V_+$ and that of input voltage $V_-$ are opposite in polarity. Due to the opposite polarities, the DC voltage components serve as a guard voltage when a small-value light signal is input or no light signal is input.

2. When light signal E is of a large value, i.e., when $|V_p| > Ig \cdot Rg$, the peak value-detecting circuit 18 operates. Thus, the input voltage Vi of the voltage-current converter circuit 28 satisfies the following formula:

$$Vi = |Vp| \quad (13)$$

By similar calculation to that of the case where a small-value light signal is input, the input voltages $V_+$ and $V_-$ of the comparator 34 are given by the following:

$$V_+ = Vo - Io.R - (\tfrac{1}{2})|Vp| + Vp \qquad (14)$$

$$V_- = Vo - Io.R + (\tfrac{1}{2})|Vp| - Vp \qquad (15)$$

As may understood from formulas (14) and (15), as in the first embodiment, normal-phase signal $V_+$ and inverted-phase signal $V_-$ can be constantly compared with each other at the level corresponding to half of potential $|Vp|$, i.e., at the level corresponding to (Vo-IR), without reference to the value of signal amplitude $|Vp|$. Therefore, the normal-phase and inverted-phase outputs of the amplifier 12 can be constantly compared in the comparator 34 with an optimal threshold level, and output signal Vout can be produced as a result of the comparison.

FIGS. 5A through 5D are waveform charts each showing the operation of the light-receiving circuit of the second embodiment.

Figures 5A, 5C:
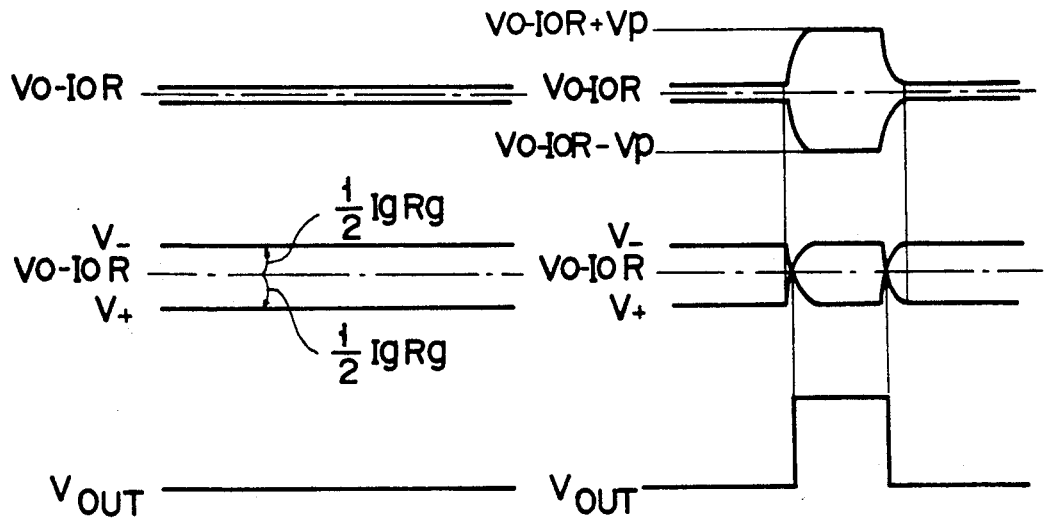
FIGS. 5A through 5D are waveform charts each showing the operation of the light-receiving circuit of the second embodiment of the present invention.

FIG. 5(A) shows the waveform obtained when $|Vp|=0$, i.e., when no signal is input.

Figures 5B, 5D:
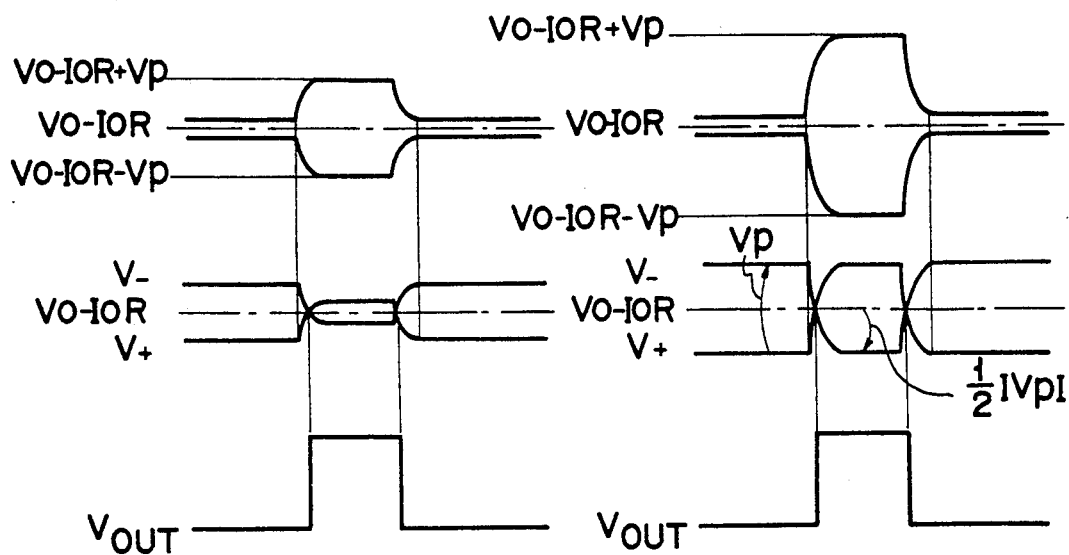

FIG. 5(B) shows the waveform obtained when the input signal satisfies the relation $|Vp|<Ig.Rg$.

FIG. 5(C) shows the waveform obtained when the input signal satisfies the relation $|Vp|=Ig.Rg$.

FIG. 5(D) shows the waveform obtained when the input signal satisfies the relation $|Vp|>Ig.Rg$.

Industrial Applicability

As has been described, the present invention can provide a light-receiving circuit which compares the outputs of an amplifier at an appropriate threshold level at all times, even if the amplifier has normal-phase and inverted-phase output terminals. Since, therefore, the light-receiving circuit can employ a wide-band, widely-dynamic amplifier, the circuit is suitable for use in a light communication system, for example.

I claim:

1. A light-receiving circuit comprising:
   an amplifier having an input terminal, a normal-phase output terminal, and an inverted-phase output terminal, said amplifier amplifying an input signal which is supplied from a light-receiving element connected to the input terminal;
   a peak value detector having a normal-phase input terminal, an inverted-phase input terminal, and an output terminal, said normal-phase input terminal being connected to the normal-phase output terminal of the amplifier, said inverted-phase input terminal being connected to the inverted-phase output terminal of the amplifier, said peak value detector detecting a peak value of an output of the amplifier;
   a voltage-current converter having an input terminal, a normal-phase output terminal, and an inverted-phase output terminal, said input terminal being connected to the output terminal of the peak value detector;
   a first resistor inserted between the normal-phase output terminal of the voltage-current converter and the normal-phase input terminal of the peak value detector;
   a second resistor inserted between the inverted-phase output terminal of the voltage-current converter and the inverted-phase input terminal of the peak value detector; and
   a comparator having a normal-phase input terminal, an inverted-phase input terminal, and an output terminal, said normal-phase input terminal being connected to the normal-phase output terminal of the voltage-current converter, said inverted-phase input terminal being connected to the inverted-phase output terminal of the voltage-current converter, said comparator comparing outputs of the amplifier with each other and producing an output signal from the output terminal thereof.

2. A light-receiving circuit according to claim 1, wherein said peak value circuit detects a voltage determined by adding an amplitude voltage supplied from the normal-phase output terminal of the amplifier to an amplitude voltage supplied from the inverted-phase output terminal of the amplifier, and supplies the voltage, thus determined, to the voltage-current converter as a peak value.

3. A light-receiving circuit according to claim 1, wherein said voltage-current converter has a mutual conductance of gm, produces currents obtained in accordance with both the mutual conductance gm and the voltage received as the peak value, and outputs the currents as a normal-phase output and an inverted-phase output, respectively.

4. A light-receiving circuit according to claim 1, wherein said first and second resistors convert the currents obtained by the voltage-current converter into voltages, respectively.

5. A light-receiving circuit according to claim 1, wherein said voltage-current converter has a mutual conductance of gm, each of said first and second resistors has a resistance of R, and the mutual conductance gm and the resistance R have a relationship given by $gm \times R = \tfrac{1}{2}$.

6. A light-receiving circuit comprising:
   an amplifier having an input terminal, a normal-phase output terminal, and an inverted-phase output terminal, said amplifier amplifying an input signal which is supplied from a light-receiving element connected to the input terminal;
   a first resistor and a second resistor which are inserted between the normal-phase and inverted-phase output terminals of the amplifier;
   a peak value detector having a normal-phase input terminal, an inverted-phase input terminal, and an output terminal, said normal-phase input terminal being connected to the normal-phase output terminal of the amplifier, said inverted-phase input terminal being connected to a point located between the first and second resistors, said peak value detector detecting a peak value of an output of the amplifier;
   a voltage-current converter having a normal-phase input terminal, an inverted-phase input terminal, a normal-phase output terminal, and an inverted-phase output terminal, said normal-phase input terminal being connected to the output terminal of the peak value detector, said inverted-phase input terminal being connected to the point located between the first and second resistors;
   a third resistor inserted between the normal-phase output terminal of the voltage-current converter and the normal-phase output terminal of the peak value detector;
   a fourth resistor inserted between the inverted-phase output terminal of the voltage-current converter and the inverted-phase output terminal of the amplifier and
   a comparator having a normal-phase input terminal, an inverted-phase input terminals, and an output terminal, said normal-phase input terminal being connected to the normal-phase output terminal of the voltage-current converter, said inverted-phase input terminal being connected to the inverted-phase output terminal of the voltage-current converter, said comparator comparing outputs of the amplifier with each other and producing an output signal from the output terminal thereof.

7. A light-receiving circuit according to claim 6, wherein said peak value detector detects a voltage which is determined by adding an amplitude voltage supplied from the normal-phase output terminal of the amplifier to a voltage obtained by voltage division by the first and second resistors, and supplies the voltage, thus determined, to the normal-phase input terminal of the voltage-current converter as a peak value.

8. A light-receiving circuit according to claim 6, wherein said first and second resistors have an equal resistance.

9. A light-receiving circuit according to claim 6, further comprising a fifth resistor whose one end is connected to the point located between the first and second resistors and whose another end is connected to the inverted-phase input terminal of the peak value detector.

10. A light-receiving circuit according to claim 6, wherein said voltage-current converter has a mutual conductance of gm, produces currents obtained in accordance with both the mutual conductance gm and a voltage difference between the normal-phase and inverted-phase input terminals thereof, and outputs the currents as a normal-phase output and an inverted-phase output, respectively.

11. A light-receiving circuit according to claim 6, wherein said third and fourth resistors convert the currents obtained by the voltage-current converter into voltages, respectively.

12. A light-receiving circuit according to claim 6, wherein said voltage-current converter has a mutual conductance of gm, each of said third and fourth resistors has a resistance of R, and the mutual conductance gm and the resistance R have a relationship given by:

$$gm \times R = \tfrac{1}{2}.$$

13. A light-receiving circuit according to claim 9, wherein each of said first and second resistors has a resistance of R1, said fifth resistor has a resistance of Rg, and resistance R1 and resistance Rg have a relationship given by:

$$\tfrac{1}{2} \times R1 >> Rg.$$

* * * * *

UNITED STATES PATENT AND TRADEMARK OFFICE
CERTIFICATE OF CORRECTION

PATENT NO. : 5,247,211
DATED : September 21, 1993
INVENTOR(S) : Shigeyuki Sakura It is certified that error appears in the above-indentified patent and that said Letters Patent is hereby corrected as shown below:

Claim 6, column 8, line 67, change "terminals" to --terminal--.

Signed and Sealed this

Twentieth Day of September, 1994

Attest:

BRUCE LEHMAN

*Attesting Officer*     *Commissioner of Patents and Trademarks*